(12) United States Patent
Zhong et al.

(10) Patent No.: US 10,971,692 B2
(45) Date of Patent: Apr. 6, 2021

(54) QUANTUM DOT LIGHT-EMITTING LAYER, QUANTUM DOT LIGHT-EMITTING DEVICE AND PREPARING METHODS THEREFOR

(71) Applicant: BOE Technology Group Co., Ltd., Beijing (CN)

(72) Inventors: Haizheng Zhong, Beijing (CN); Shuai Chang, Beijing (CN); Xiaomei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/504,439

(22) Filed: Jul. 8, 2019

(65) Prior Publication Data

US 2020/0013976 A1 Jan. 9, 2020

(30) Foreign Application Priority Data

Jul. 9, 2018 (CN) .......................... 201810743690.8

(51) Int. Cl.
*H01L 51/50* (2006.01)
*H01L 51/56* (2006.01)
(Continued)

(52) U.S. Cl.
CPC ........ *H01L 51/502* (2013.01); *H01L 51/0077* (2013.01); *H01L 51/56* (2013.01);
(Continued)

(58) Field of Classification Search
CPC .................................................. H01L 51/502
See application file for complete search history.

(56) References Cited

U.S. PATENT DOCUMENTS

| 2016/0005987 A1* | 1/2016 | Koposov | ............. H01L 51/4226 136/263 |
| 2016/0248028 A1* | 8/2016 | Huang | ................ H01L 51/4213 |
| 2018/0040769 A1 | 2/2018 | Gao et al. | |

FOREIGN PATENT DOCUMENTS

| CN | 107267144 A | 10/2017 |
| CN | 107460535 A | 12/2017 |
| CN | 107768529 A | 3/2018 |

OTHER PUBLICATIONS

CN-107267144A (2020 Google Translate from Google Patents) (Year: 2020).*

(Continued)

*Primary Examiner* — Omar F Mojaddedi
(74) *Attorney, Agent, or Firm* — Fay Sharpe LLP

(57) ABSTRACT

The present disclosure relates to a quantum dot light-emitting layer, a quantum dot light-emitting device and preparing methods therefor and belongs to the field of liquid crystal display. The preparing method for a quantum dot light-emitting layer includes: placing a first halide AX and a second halide $BX_2$ in a solvent; stirring and dispersing the reaction system formed by the first halide AX, the second halide $BX_2$ and the solvent at a set temperature for a set time period; cooling the reaction system at a cooling rate of 0.1° C./24 h-1° C./24 h to generate an $A_4BX_6$ single crystal thin film containing $ABX_3$ quantum dots, and using the $A_4BX_6$ single crystal thin film containing $ABX_3$ quantum dots as the quantum dot light-emitting layer; wherein A includes one of $Cs^+$, $CH_3NH_3^+$ and $HC(NH_2)_2^+$; B includes one of $Pb^{2+}$ and $Sn^{2+}$; and X includes one of $Cl^-$, $Br^-$ and $I^-$.

9 Claims, 4 Drawing Sheets

(51) Int. Cl.
*H01L 51/52* (2006.01)
*H01L 51/00* (2006.01)
*H01L 27/32* (2006.01)
*H01G 9/20* (2006.01)
*H01G 9/00* (2006.01)
*C30B 7/00* (2006.01)
*C30B 7/14* (2006.01)
*C30B 29/54* (2006.01)

(52) U.S. Cl.
CPC ...... *H01L 51/5056* (2013.01); *H01L 51/5072* (2013.01); *H01L 51/5203* (2013.01)

(56) References Cited

OTHER PUBLICATIONS

First office action of Chinese application No. 201810743690.8 dated Oct. 8, 2019.

* cited by examiner

QUANTUM DOT LIGHT-EMITTING LAYER, QUANTUM DOT LIGHT-EMITTING DEVICE AND PREPARING METHODS THEREFOR

CROSS-REFERENCE TO RELATED APPLICATION

This application claims priority to Chinese Patent Application No. 201810743690.8, filed on Jul. 9, 2018 and entitled "QUANTUM DOT LIGHT-EMITTING LAYER, QUANTUM DOT LIGHT-EMITTING DEVICE AND PREPARING METHODS THEREFOR", the entire contents of which are incorporated herein by reference.

TECHNICAL FIELD

The present disclosure relates to the field of liquid crystal display, and in particular, to a quantum dot light-emitting layer, a quantum dot light-emitting device and preparing methods therefor.

BACKGROUND

The metal halogen perovskite material refers to a metal halide having a perovskite structure, and due to the characteristics such as an obvious quantum confined effect, a relatively high fluorescence quantum yield, and a uniform size, etc., the metal halogen perovskite quantum dots based on the metal halogen perovskite material have attained extensive attention in the field of optoelectronic applications.

In the related art, a perovskite $CH_3NH_3PbI_3$ polycrystalline thin film is synthesized by sequentially depositing $PbI_2$ and $CH_3NH_3I$ on a nano-polyporous titanium dioxide thin film through a two-step solution spin coating method, and is used as a quantum dot light-emitting layer in a quantum dot light-emitting diode. Alternatively, the metal halogen perovskite quantum dots are combined with a polyethylene oxide polymer to form a thin film containing the metal halogen perovskite quantum dots.

SUMMARY

The embodiments of the present disclosure provide a quantum dot light-emitting layer, a quantum dot light-emitting device, and preparing methods therefor. The technical solution is as follows.

In one aspect, there is provided a preparing method for a quantum dot light-emitting layer, including: placing a first halide AX and a second halide $BX_2$ in a solvent; stirring and dispersing a reaction system formed by the first halide AX, the second halide $BX_2$ and the solvent at a set temperature for a set time period; and cooling the reaction system at a cooling rate of 0.1° C./24 h-1° C./24 h to generate an $A_4BX_6$ single crystal thin film containing $ABX_3$ quantum dots, and using the $A_4BX_6$ single crystal thin film containing $ABX_3$ quantum dots as the quantum dot light-emitting layer; wherein A includes one of $Cs^+$, $CH_3NH_3^+$ and $HC(NH_2)_2^+$; B includes one of $Pb^{2+}$ and $Sn^{2+}$; and X includes one of $Cl^-$, $Br^-$ and $I^-$.

In one possible embodiment, a molar ratio of the first halide AX to the second halide $BX_2$ to the solvent is 3-6:1:3-6.

In one possible embodiment, the solvent includes: an organic solvent and an additive with a volume ratio of 1-5:1; and the additive includes hydrohalic acid.

In one possible embodiment, the set temperature includes 60° C.-80° C.; and the set time period includes 20 h-30 h.

In another aspect, there is provided a quantum dot light-emitting layer, prepared by any above preparing method. The quantum dot light-emitting layer includes an $A_4BX_6$ single crystal thin film containing $ABX_3$ quantum dots; and
wherein A comprises one of $Cs^+$, $CH_3NH_3^+$ and $HC(NH_2)_2^+$;
B includes one of $Pb^{2+}$ and $Sn^{2+}$; and
X includes one of $Cl^-$, $Br^-$ and $I^-$.

In yet another aspect, there is provided a quantum dot light-emitting device, including any above quantum dot light-emitting layer. The quantum dot light-emitting layer includes an $A_4BX_6$ single crystal thin film containing $ABX_3$ quantum dots; and
wherein A comprises one of $Cs^+$, $CH_3NH_3^+$ and $HC(NH_2)_2^+$;
B includes one of $Pb^{2+}$ and $Sn^{2+}$; and
X includes one of $Cl^-$, $Br^-$ and $I^-$.

In one possible embodiment, the quantum dot light-emitting device includes: a transparent conductive electrode, a hole transport layer, the quantum dot light-emitting layer, an electron transport layer, and a metal electrode which are sequentially stacked.

In one possible embodiment, the quantum dot light-emitting device includes: a transparent conductive electrode, an electron transport layer, the quantum dot light-emitting layer, a hole transport layer, and a metal electrode which are sequentially stacked.

In one possible embodiment, the quantum dot light-emitting device includes: a transparent conductive electrode, the quantum dot light-emitting layer, and a metal electrode which are sequentially stacked.

In still a further aspect, there is provided a preparing method for a quantum dot light-emitting device, and the preparing method includes: forming a quantum dot light-emitting layer by the above preparing method for the quantum dot light-emitting layer; forming a first electrode; and forming a second electrode.

In one possible embodiment, the forming the first electrode comprises: forming a transparent conductive electrode; a step of forming a hole transport layer on the transparent conductive electrode is comprised between the forming the transparent conductive electrode and the forming the quantum dot light-emitting layer; a step of forming an electron transport layer on the quantum dot light-emitting layer is comprised between the forming the quantum dot light-emitting layer and the forming the second electrode; and the forming the second electrode comprises: forming a metal electrode on the electron transport layer.

In one possible embodiment, the forming the first electrode comprises: forming a transparent conductive electrode; a step of forming an electron transport layer on the transparent conductive electrode is comprised between the forming the transparent conductive electrode and the forming the quantum dot light-emitting layer; a step of forming a hole transport layer on the quantum dot light-emitting layer is comprised between the forming the quantum dot light-emitting layer and the forming the second electrode; and the forming the second electrode comprises: forming a metal electrode on the hole transport layer.

In one possible embodiment, the forming the first electrode comprises: forming a transparent conductive electrode; a step of forming the quantum dot light-emitting layer on the transparent conductive electrode is comprised between the forming the transparent conductive electrode and the forming the second electrode; and the forming the second electrode comprises: forming a metal electrode.

In one possible embodiment, the forming the first electrode comprises: forming a transparent conductive electrode on one surface of the quantum dot light-emitting layer; and the forming the second electrode comprises: forming a metal electrode on the other surface of the quantum dot light-emitting layer.

BRIEF DESCRIPTION OF THE DRAWINGS

To describe the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
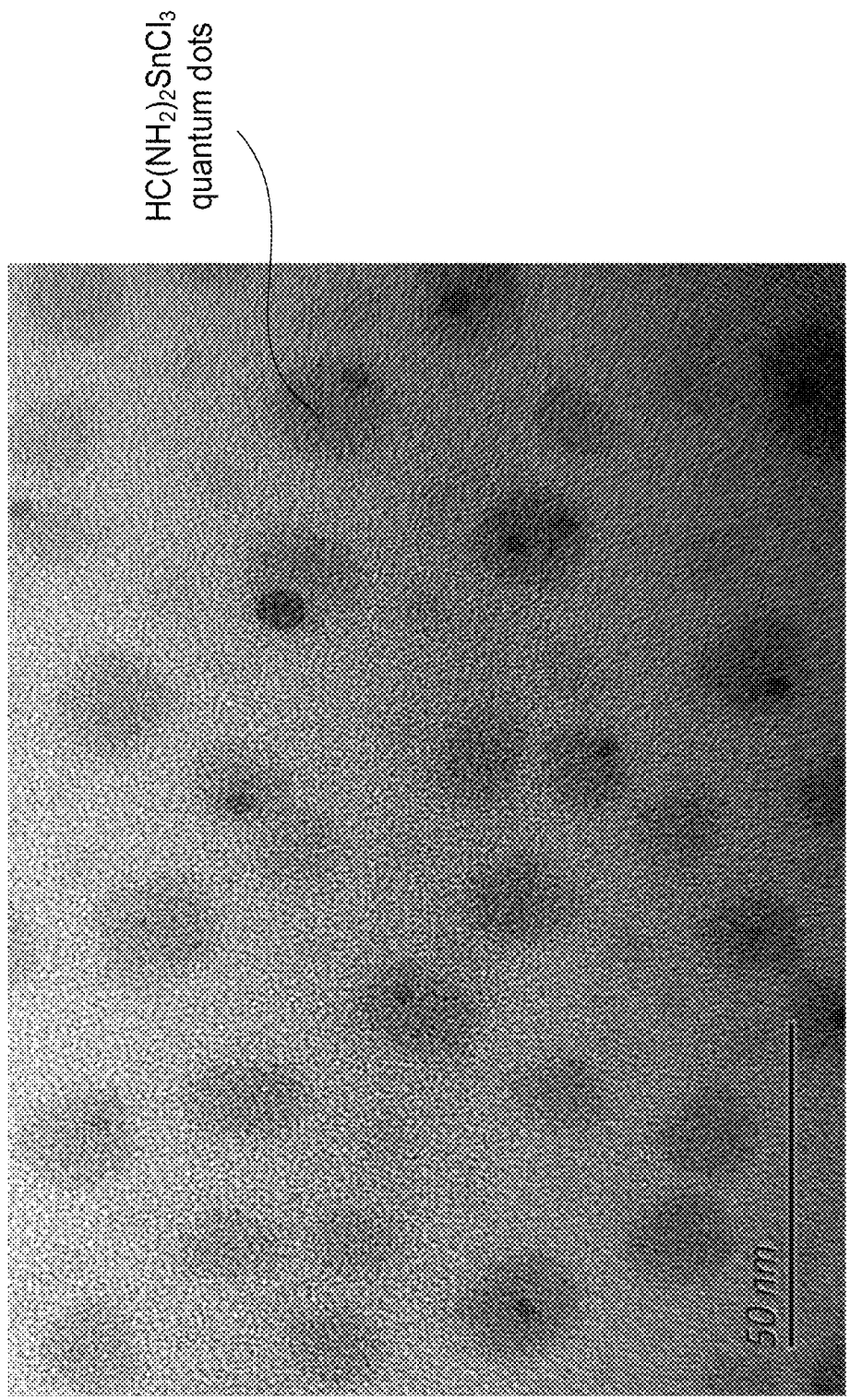
FIG. 1 is a schematic structural diagram of an $A_4BX_6$ single crystal thin film containing $ABX_3$ quantum dots provided by an exemplary embodiment of the present disclosure.

To present the objects, technical solutions and advantages of the present disclosure more clearly, embodiments of the present disclosure will be described in further detail in conjunction with the accompanying drawings.

In one aspect, the embodiments of the present disclosure provide a preparing method for a quantum dot light-emitting layer, including: placing a first halide AX and a second halide $BX_2$ in a solvent.

The reaction system formed by the first halide AX, the second halide $BX_2$ and the solvent are stirred and dispersed at a set temperature for a set time period, such that the reaction system is cooled at a cooling rate of 0.1° C./24 h-1° C./24 h to generate an $A_4BX_6$ single crystal thin film containing $ABX_3$ quantum dots, and the $A_4BX_6$ single crystal thin film containing $ABX_3$ quantum dots is used as the quantum dot light-emitting layer.

Wherein, A includes $Cs^+$, $CH_3NH_3^+$ or $HC(NH_2)_2^+$;
B includes $Pb^{2+}$ or $Sn^{2+}$; and
X includes $Cl^-$, $Br^-$ or $I^-$.

The molar ratio of the first halide AX to the second halide $BX_2$ to the solvent is 3-6:1:3-6.

According to the method provided by the embodiments of the present disclosure, the first halide AX and the second halide $BX_2$ are placed in the solvent, stirred and dispersed at the set temperature, and cooled at the cooling rate of 0.1° C./24 h-1° C./24 h, and the $A_4BX_6$ single crystal thin film containing $ABX_3$ quantum dots can be produced, thereby improving the dispersing uniformity of the $ABX_3$ quantum dots in the $A_4BX_6$ single crystal thin film, and solving the problem of poor film forming ability of the $ABX_3$ quantum dots. The $A_4BX_6$ single crystal thin film plays a role of protection on the $ABX_3$ quantum dots contained in the $A_4BX_6$ single crystal thin film. In addition, the prepared quantum dot light-emitting layer has higher light-emitting efficiency based on the $A_4BX_6$ single crystal thin film containing $ABX_3$ quantum dots.

Wherein, after the first halide AX and the second halide $BX_2$ are sufficiently dissolved in the solvent at the set temperature, a temperature difference is generated by the above cooling process, then a saturation difference is generated, thereby achieving the purpose of generating the $A_4BX_6$ single crystal thin film. In the process of generating the $A_4BX_6$ single crystal thin film, $ABX_3$ quantum dots (particles having a grain size up to the order of magnitude of quantum dots) are also generated to form the $A_4BX_6$ single crystal thin film containing the $ABX_3$ quantum dots.

For the above cooling process, in order to ensure the stable generation of the single crystal thin film, the cooling rate is controlled at 0.1° C./24 h-1° C./24 h, for example, 0.1° C./24 h, 0.2° C./24 h, 0.3° C./24 h, 0.4° C./24 h, 0.5° C./24 h, 0.6° C./24 h, 0.7° C./24 h, 0.8° C./24 h, 0.9° C./24 h or 1° C./24 h, etc. In general, the reaction system can be cooled to the room temperature, and the room temperature can be between 20° C. and 30° C.

The A provided by the present disclosure can include metal cation, and can also include organic cation. The metal cation can include: $Cs^+$, etc., and the organic cation can include: $CH_3NH_3^+$ or $HC(NH_2)_2^+$, etc.

Wherein, the thickness of the formed $A_4BX_6$ single crystal thin film is generally controlled to be 2-3 micrometers (μm). And if the thickness is higher than 2-3 micrometers, dry machining such as dry wire cutting can be performed at a later stage. The mass ratio of the $ABX_3$ quantum dots in the $A_4BX_6$ single crystal thin film is generally less than 5%.

Wherein, the molar ratio of the first halide AX to the second halide $BX_2$ to the solvent is 3-6:1:3-6, to achieve the purpose of precipitating the single crystal, after sufficiently dissolving the reaction raw materials at the set temperature, when the temperature is lowered to the room temperature. For example, the molar ratio of the first halide AX to the second halide $BX_2$ to the solvent can be 3:1:3, 3:1:4, 3:1:5, 3:1:6, 4:1:3 or 5:1:6, etc.

For example, the "$A_4BX_6$ single crystal thin film containing $ABX_3$ quantum dots" according to the embodiments of the present disclosure can be:

a $Cs_4PbBr_6$ single crystal thin film containing $CsPbBr_3$ quantum dots; or a $Cs_4PbCl_6$ single crystal thin film containing $CsPbCl_3$ quantum dots; or a $Cs_4PbI_6$ single crystal thin film containing $CsPbI_3$ quantum dots; or a $Cs_4SnBr_6$ single crystal thin film containing $CsSnBr_3$ quantum dots; or a $Cs_4SnCl_6$ single crystal thin film containing $CsSnCl_3$ quantum dots; or a $Cs_4SnI_6$ single crystal thin film containing $CsSnI_3$ quantum dots; or a $CH_3NH_3PbBr_6$ single crystal thin film containing $CH_3NH_3PbBr_3$ quantum dots; or a $CH_3NH_3PbCl_6$ single crystal thin film containing $CH_3NH_3PbCl_3$ quantum dots; or a $CH_3NH_3PbI_6$ single crystal thin film containing $CH_3NH_3PbI_3$ quantum dots; or a $CH_3NH_3SnI_6$ single crystal thin film containing $CH_3NH_3SnI_3$ quantum dots; or a $CH_3NH_3SnCl_6$ single crystal thin film containing $CH_3NH_3SnCl_3$ quantum dots; or a $CH_3NH_3SnBr_6$ single crystal thin film containing $CH_3NH_3SnBr_3$ quantum dots; or a $HC(NH_2)_2PbBr_6$ single crystal thin film containing $HC(NH_2)_2PbBr_3$ quantum dots; or a $HC(NH_2)_2PbCl_6$ single crystal thin film containing $HC(NH_2)_2PbCl_3$ quantum dots; or a $HC(NH_2)_2PbI_6$ single crystal thin film containing $HC(NH_2)_2PbI_3$ quantum dots; or a $HC(NH_2)_2SnI_6$ single crystal thin film containing $HC(NH_2)_2SnI_3$ quantum dots; or a $HC(NH_2)_2SnCl_6$ single crystal thin film containing $HC(NH_2)_2SnCl_3$ quantum dots; or a $HC(NH_2)_2SnBr_6$ single crystal thin film containing $HC(NH_2)_2SnBr_3$ quantum dots, etc.

In the embodiments of the present disclosure, the solvent is configured to provide a dissolution environment for the generation of the above single crystal thin film, and enable the respective reaction raw materials to uniformly disperse. As an example, the solvent can include an organic solvent and an additive with a volume ratio of 1-5:1. As an example, the additive can be hydrohalic acid. By adding the additive of the above ratio to the organic solvent, the solubility of the reaction raw materials can be remarkably increased, and the reaction raw materials have a positive solubility property.

When the additive is the hydrohalic acid, the halogen involved in the hydrohalic acid is same with the halogen involved in the reaction raw materials for the purpose of positive dissolution. The volume ratio of the organic solvent to the additive can include 1:1, 2:1, 3:1, 4:1, or 5:1, etc.

For example, the organic solvent can include N,N-dimethylformamide (DMF), dimethyl sulfoxide (DMSO), butyrolactone (GBL) or acetonitrile (ACN), etc.

The above hydrohalic acid can include hydrochloric acid, hydrobromic acid or hydroiodic acid.

Wherein, in the dispersion process of the first halide AX and the second halide $BX_2$, the involved set temperature includes 60° C.-80° C., for example, 60° C., 65° C., 70° C., 75° C. or 80° C., etc. By defining the temperature as described above, the solubility of the reaction raw materials can be remarkably increased.

The set time period involved in the above preparing method includes 20 h-30 h, for example, 20 h, 22 h, 24 h, 26 h, 28 h, 29 h or 30 h, etc. By defining the above time as described above, the reaction raw materials can be fully diffused under the premise of providing the sufficient cooling time.

The preparing method for the quantum dot light-emitting layer provided by the embodiments of the present disclosure is further described below by the optional implementation.

Implementation:

A reaction system in which a molar ratio of CsCl to $PbCl_2$ to N,N-dimethylformamide is 3:1:3 is dispersed under stirring for 20 hours at 60° C. The reaction system is cooled to 20° C. at a temperature decreasing rate of 0.1° C./24 h to generate a $Cs_4PbCl_6$ single crystal thin film containing $CsPbCl_3$ quantum dots. The $Cs_4PbCl_6$ single crystal thin film containing $CsPbCl_3$ quantum dots is used as the quantum dot light-emitting layer.

Implementation:

A reaction system in which a molar ratio of CsBr to $PbBr_2$ to dimethyl sulfoxide is 3:1:4 is dispersed under stirring for 22 hours at 65° C. The reaction system is cooled to 20° C. at a temperature decreasing rate of 0.3° C./24 h to generate a $Cs_4PbBr_6$ single crystal thin film containing $CsPbBr_3$ quantum dots. The $Cs_4PbBr_6$ single crystal thin film containing $CsPbBr_3$ quantum dots is used as the quantum dot light-emitting layer.

Implementation:

A reaction system in which a molar ratio of $CH_3NH_3I$ to $SnI_2$ to butyrolactone is 3:1:5 is dispersed under stirring for 24 hours at 75° C. The reaction system is cooled to 20° C. at a temperature decreasing rate of 0.4° C./24 h to generate a $CH_3NH_3SnI_6$ single crystal thin film containing $CH_3NH_3SnI_3$ quantum dots. The $CH_3NH_3SnI_6$ single crystal thin film containing $CH_3NH_3SnI_3$ quantum dots is used as the quantum dot light-emitting layer.

Implementation:

A reaction system in which a molar ratio of $HC(NH_2)_2Cl$ to $SnCl_2$ to acetonitrile is 3:1:6 is dispersed under stirring for 24 hours at 80° C. The reaction system is cooled to 20° C. at a temperature decreasing rate of 0.7° C./24 h to generate a $HC(NH_2)_2SnCl_6$ single crystal thin film containing $HC(NH_2)_2SnCl_3$ quantum dots. The $HC(NH_2)_2SnCl_6$ single crystal thin film containing $HC(NH_2)_2SnCl_3$ quantum dots is used as the quantum dot light-emitting layer.

As an example, embodiments of the present disclosure provide a structural diagram of the $HC(NH_2)_2SnCl_6$ single crystal thin film containing $HC(NH_2)_2SnCl_3$ quantum dots prepared by the preparing method of the above embodiments. Referring to FIG. 1, darker dots in FIG. 1 are the $HC(NH_2)_2SnCl_3$ quantum dots provided by the embodiment of the present disclosure. Wherein, 50 nm in FIG. 1 is considered as a measuring scale.

In another aspect, the embodiments of the present disclosure further provide a quantum dot light-emitting layer prepared by the above preparing method. And the quantum dot light-emitting layer includes an $A_4BX_6$ single crystal thin film, and the $A_4BX_6$ single crystal thin film contains $ABX_3$ quantum dots.

Wherein, A includes $Cs^+$, $CH_3NH_3^+$ or $HC(NH_2)_2^+$;
B includes $Pb^{2+}$ or $Sn^{2+}$; and
X includes $Cl^-$, $Br^-$ or $I^-$.

It can be understood that the quantum dot light-emitting layer includes: an $A_4BX_6$ single crystal thin film, and $ABX_3$ quantum dots contained in the $A_4BX_6$ single crystal thin film. Further, the mass ratio of the $ABX_3$ quantum dots is less than 5%.

In yet another aspect, the embodiments of the present disclosure further provide a quantum dot light-emitting device, and the quantum dot light-emitting device includes the above quantum dot light-emitting layer. And the quantum dot light-emitting layer includes an $A_4BX_6$ single crystal thin film, and the $A_4BX_6$ single crystal thin film contains $ABX_3$ quantum dots.

Wherein, A includes $Cs^+$, $CH_3NH_3^+$ or $HC(NH_2)_2^+$;
B includes $Pb^{2+}$ or $Sn^{2+}$; and
X includes $Cl^-$, $Br^-$ or $I^-$.

The quantum dot light-emitting layer serving as a quantum dot light-emitting layer of the quantum dot light-emitting device, can significantly improve the light-emitting efficiency of the quantum dot light-emitting device.

Wherein, the quantum dot light-emitting device can be understood as a quantum dot light-emitting diode. Considering that the quantum dot light-emitting device can further include other functional layers, and based on different arrangements of the functional layers, the formed quantum dot light-emitting device may also be different, which are explained respectively as follows.

Figure 2:
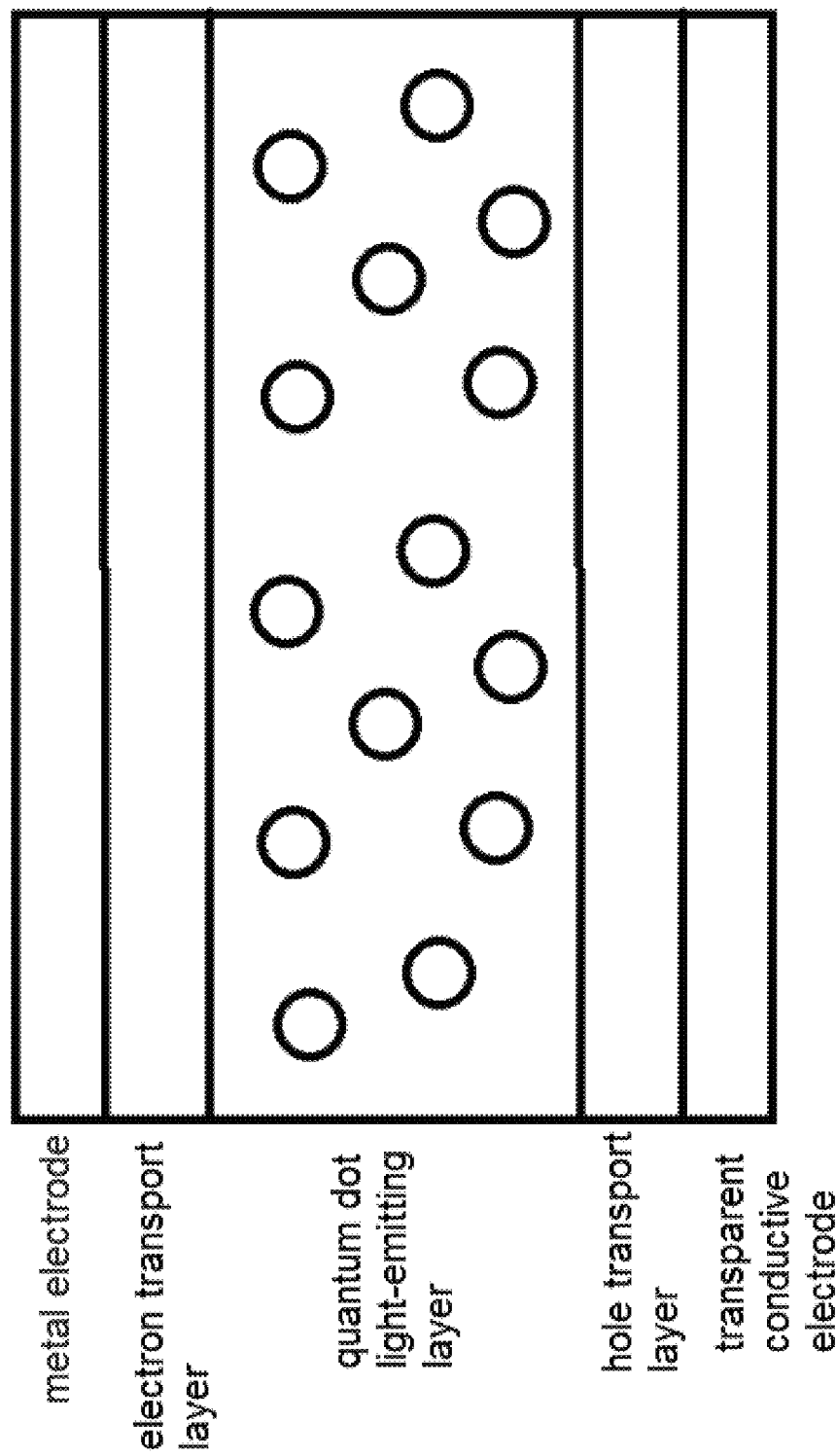
FIG. 2 is a schematic structural diagram of a formal quantum dot light-emitting device provided by an exemplary embodiment of the present disclosure.

As an example 1, as shown in FIG. 2, the quantum dot light-emitting device includes: a transparent conductive electrode, a hole transport layer, a quantum dot light-emitting layer, an electron transport layer, and a metal electrode which are sequentially stacked. At this point, the quantum dot light-emitting device is a formal electroluminescent device.

Figure 3:
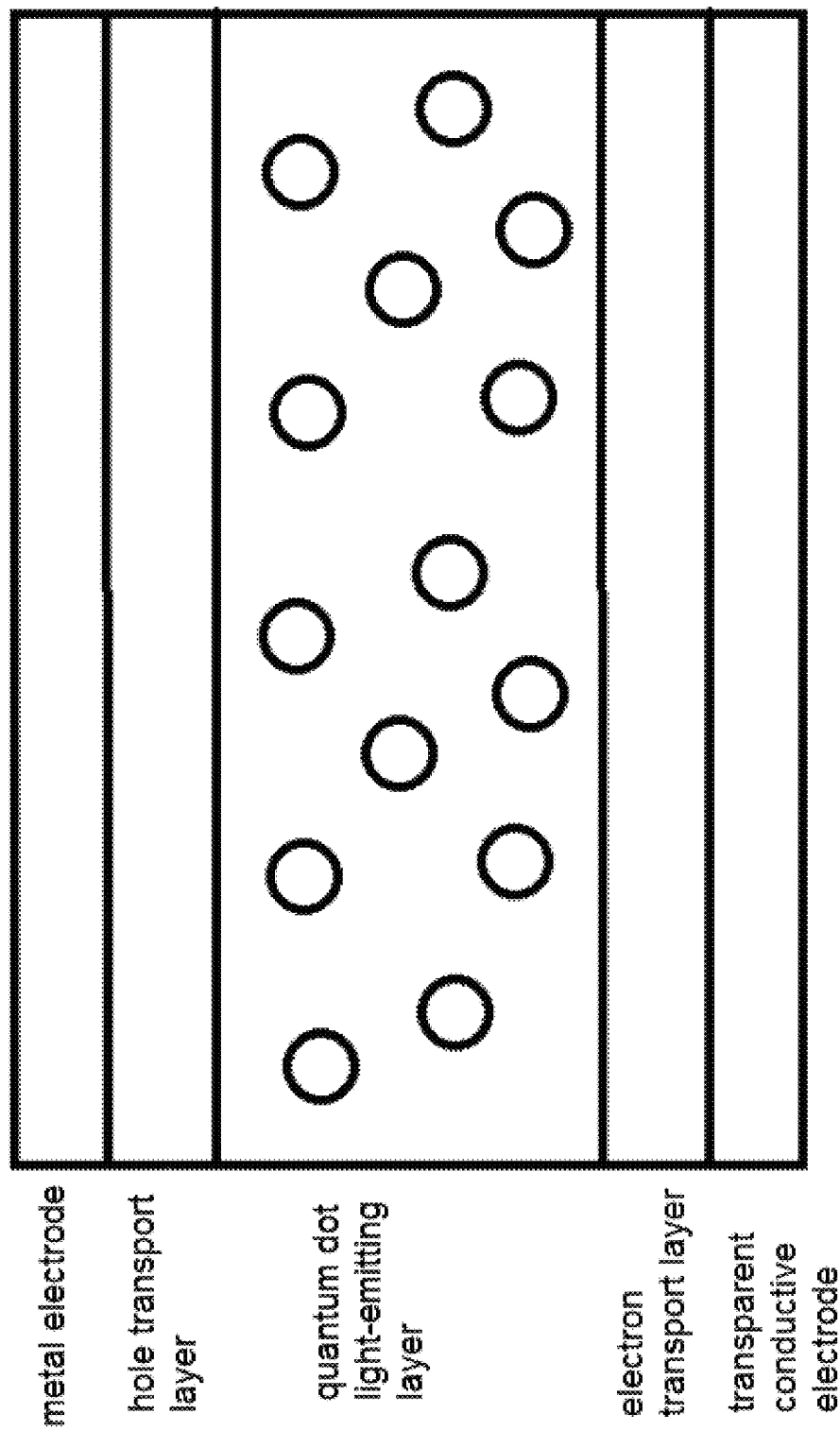
FIG. 3 is a schematic structural diagram of an inverted quantum dot light-emitting device provided by another exemplary embodiment of the present disclosure.

As an example 2, as shown in FIG. 3, the quantum dot light-emitting device includes: a transparent conductive electrode, an electron transport layer, a quantum dot light-emitting layer, a hole transport layer, and a metal electrode which are sequentially stacked. At this point, the quantum dot light-emitting device is an inverted electroluminescent device.

Figure 4:
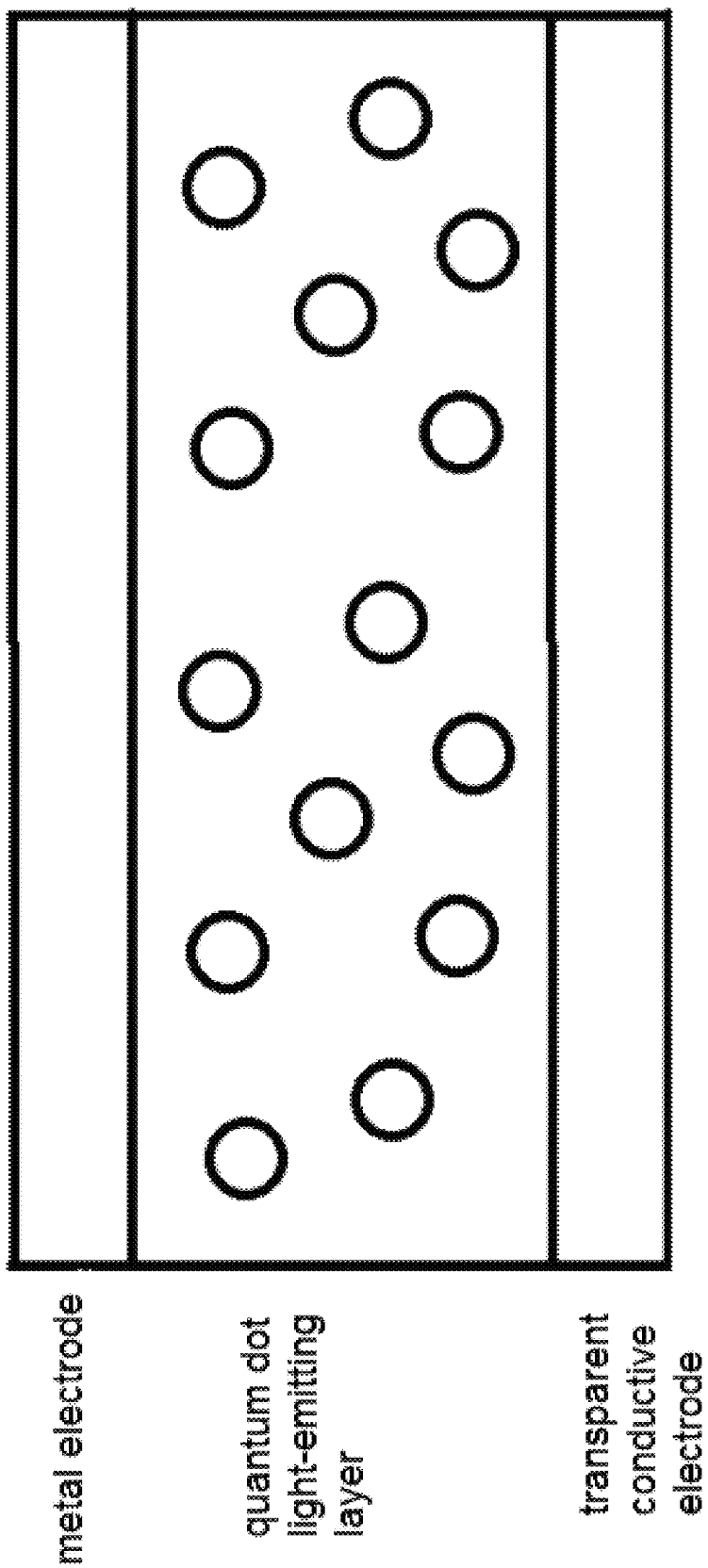
FIG. 4 is a schematic structural diagram of a quantum dot light-emitting device, without a transport layer structure, provided by an exemplary embodiment of the present disclosure.

As an example 3, as shown in FIG. 4, the quantum dot light-emitting device includes: a transparent conductive electrode, a quantum dot light-emitting layer, and a metal electrode which are sequentially stacked. At this point, the quantum dot light-emitting device is an electroluminescent device without a transport layer structure.

Wherein, in each of the above quantum dot light-emitting devices, the involved hole transport layer includes: PEDOT:PSS, PVK (polyvinylcarbazole), Poly-TPD (poly[bis(4-phenyl)(4-butylphenyl)amine]), TFB (poly(9,9-dioctylfluorene-CO—N-(4-butylphenyl)diphenylamine)), CBP (4,4'-N,N'-dicarbazole-biphenyl) or $NiO_x$, etc. Wherein, the PEDOT includes a polymer of EDOT (3,4-ethylenedioxythiophene monomer), and the PSS is polystyrene sulfonate.

The involved transparent conductive electrode includes: ITO (indium tin oxide), FTO (fluorine-doped $SnO_2$ transparent conductive glass ($SnO_2$:F)), or a silver nanowire network, etc.

The involved electron transport layer includes: inorganic nanoparticles, such as ZnO, ZnMgO or ZnAlO, etc., or electron transport organic small molecules, such as TPBi (1,3,5-tris(1-phenyl-1H-benzimidazole-2-yl)benzene), etc.

The electrode material of the involved metal electrode includes Au, Ag or Al, etc.

The quantum dot light-emitting devices based on the above various structures are respectively explained according to the preparing methods therefor.

A preparing method for a quantum dot light-emitting device includes:
forming a quantum dot light-emitting layer by the above preparing method for the quantum dot light-emitting layer;
forming a first electrode; and
forming a second electrode.

In a possible implementation, with respect to the quantum dot light-emitting device of Example 1, said forming the first electrode includes: forming a transparent conductive electrode.

A step of forming a hole transport layer on the transparent conductive electrode is included between said forming the transparent conductive electrode and said forming the quantum dot light-emitting layer; a step of forming an electron transport layer on the quantum dot light-emitting layer is included between said forming the quantum dot light-emitting layer and said forming the second electrode; and said forming the second electrode includes: forming a metal electrode on the electron transport layer.

Wherein, the transparent conductive electrode provided with the hole transport layer can be prepared by the following method: depositing a material for preparing the hole transport layer on the transparent conductive electrode (as a substrate) by spin coating, evaporation or sputtering, etc., to form the hole transport layer.

Growing the quantum dot light-emitting layer on the hole transport layer can include: placing the transparent conductive electrode provided with the hole transport layer in a reaction system for generating the quantum dot light-emitting layer, and directly forming the quantum dot light-emitting layer on the hole transport layer.

The above operation steps are summarized in conjunction with the example below.

(1) The hole transport layer is prepared on the transparent conductive electrode by spin coating, evaporation or sputtering, etc., to obtain a transparent conductive electrode/hole transport layer substrate, thereby obtaining the substrate having the hole transport layer and the transparent conductive electrode.

(2) The first halide CsBr, the second halide $PbBr_2$, and the organic solvent component in the solvent are added to a growth bottle to be uniformly mixed, and then the additive hydrobromic acid is added to the growth bottle to obtain a reaction system. The above reaction system is stirred and dispersed at 70° C. for 24 h. During the process, the mixed solution in the growth bottle changes from yellow to light green, and finally tends to be transparent and clear. Wherein, the molar ratio of the first halide CsBr to the second halide $PbBr_2$ to the solvent is 4:1:4; the organic solvent in the solvent is N,N-dimethylformamide, and the volume ratio of the N,N-dimethylformamide to the additive is 3:1.

(3) The prepared transparent conductive electrode/hole transport layer substrate is placed in the growth bottle, and the reaction system in the growth bottle is slowly cooled. The cooling rate is controlled at 0.1° C./24 h-1° C./24 h (for example, 0.5° C./24 h). After cooling to the room temperature, the $Cs_4PbBr_6$ single crystal thin film grown on the hole transport layer can be obtained.

The $Cs_4PbBr_6$ single crystal thin film is subjected to photoluminescence (PL) analysis and transmission electron microscopy (TEM) analysis, and it can be observed that $CsPbBr_3$ quantum dots are contained in the $Cs_4PbBr_6$ single crystal thin film.

(4) On the grown $Cs_4PhBr_6$ single crystal thin film, the electron transport layer is prepared by spin coating, evaporation or sputtering, etc. Then the quantum dot light-emitting device can be obtained by evaporating the metal electrode on the electron transport layer.

The above involved growth bottle can include a wild-mouth bottle, a single crystal culture bottle or an erlenmeyer flask, etc.

In a possible implementation, with respect to the quantum dot light-emitting device of example 2, said forming the first electrode includes: forming a transparent conductive electrode.

A step of forming an electron transport layer on the transparent conductive electrode is included between said forming the transparent conductive electrode and said forming the quantum dot light-emitting layer; a step of forming a hole transport layer on the quantum dot light-emitting layer is included between said forming the quantum dot light-emitting layer and said forming the second electrode; and said forming the second electrode includes: forming a metal electrode on the hole transport layer.

Wherein, the transparent conductive electrode provided with the electron transport layer can be prepared by the following method: depositing a material for preparing the electron transport layer on the transparent conductive electrode (as a substrate) by spin coating, evaporation or sputtering, etc., to form the electron transport layer.

Growing the quantum dot light-emitting layer on the electron transport layer can include: placing the transparent conductive electrode provided with the electron transport layer in a reaction system for generating the quantum dot light-emitting layer, and directly forming the quantum dot light-emitting layer on the electron transport layer.

The above operation steps are summarized in conjunction with the example below.

(1) The electron transport layer is prepared on the transparent conductive electrode by spin coating, evaporation or sputtering, etc., to obtain a transparent conductive electrode/electron transport layer substrate, thereby obtaining the substrate having the electron transport layer and the transparent conductive electrode.

(2) The first halide CsBr, the second halide $PbBr_2$, and the organic solvent component in the solvent are added to the growth bottle to be uniformly mixed, and then the additive hydrobromic acid is added to the growth bottle to obtain a reaction system. The above reaction system is stirred and dispersed at 70° C. for 24 h. During the process, the mixed solution in the growth bottle changes from yellow to light green, and finally tends to be transparent and clear. Wherein, the molar ratio of the first halide CsBr to the second halide $PbBr_2$ to the solvent is 4:1:4; the organic solvent in the solvent is N,N-dimethylformamide, and the volume ratio of the N,N-dimethylformamide to the additive is 3:1.

(3) The prepared transparent conductive electrode/electron transport layer substrate is placed in the growth bottle, and the reaction system in the growth bottle is slowly cooled. The cooling rate is controlled at 0.1° C./24 h-1° C./24 h (for example, 0.5° C./24 h). After cooling to the room temperature, the $Cs_4PbBr_6$ single crystal thin film grown on the electron transport layer can be obtained.

The $Cs_4PbBr_6$ single crystal thin film is subjected to photoluminescence analysis and transmission electron microscopy analysis, and it can be observed that the $CsPbBr_3$ quantum dots are contained in the $Cs_4PbBr_6$ single crystal thin film.

(4) The hole transport layer is prepared on the grown $Cs_4PbBr_6$ single crystal thin film by spin coating, evaporation or sputtering, etc. Thereafter, the quantum dot light-emitting device is obtained by evaporating the metal electrode on the hole transport layer.

It can be seen that the preparing steps of the quantum dot light-emitting device of example 2 are substantially the same as those of example 1, except that the positions of the hole transport layer and the electron transport layer are reversed.

In a possible implementation, with respect to the quantum dot light-emitting device of example 3, said forming the first electrode includes: forming a transparent conductive electrode.

A step of forming a quantum dot light-emitting layer on the transparent conductive electrode is included between said forming the transparent conductive electrode and said forming the second electrode; and said forming the second electrode includes: forming a metal electrode.

It can be understood that, in the preparing method, the quantum dot light-emitting layer directly grows on the transparent conductive electrode, that is, in-situ growth.

The above operation steps are summarized in conjunction with the example below.

(1) The first halide CsBr, the second halide $PbBr_2$, and the organic solvent component in the solvent are added to a growth bottle to be uniformly mixed, and then the additive hydrobromic acid is added to the growth bottle to obtain a reaction system. The above reaction system is stirred and dispersed at 75° C. for 28 h. During the process, the mixed solution in the growth bottle changes from yellow to light green, and finally tends to be transparent and clear. Wherein, the molar ratio of the first halide CsBr to the second halide $PbBr_2$ to the solvent is 4:1:4; the organic solvent in the solvent is N,N-dimethylformamide, and the volume ratio of the N,N-dimethylformamide to the additive is 4:1.

(2) The transparent conductive electrode is placed in the growth bottle, and the reaction system in the growth bottle is slowly cooled. The cooling rate is controlled at 0.1° C./24 h-1° C./24 h. After cooling to the room temperature, the $Cs_4PbBr_6$ single crystal thin film grown on the transparent conductive electrode can be obtained.

(3) The quantum dot light-emitting device can be obtained by evaporating the metal electrode on the grown $Cs_4PbBr_6$ single crystal thin film.

In addition to the above preparing method for the quantum dot light-emitting device shown in example 3, in a possible implementation, the quantum dot light-emitting device shown in example 3 can also be prepared by the following method, and the involved preparing method can include:

forming a first electrode, which includes:
forming a transparent conductive electrode on one surface of the quantum dot light-emitting layer; and
forming a second electrode, which includes: forming a metal electrode on the other surface of the quantum dot light-emitting layer.

It can be understood that the preparing method first forms the quantum dot light-emitting layer, and then forms the transparent conductive electrode and the metal electrode thereon, that is, ex-situ growth.

The above operation steps are summarized in conjunction with the example below.

(1) The first halide CsBr, the second halide $PbBr_2$, and the organic solvent component in the solvent are added to a growth bottle to be uniformly mixed, and then the additive hydrobromic acid is added to the growth bottle to obtain a reaction system. The above reaction system is stirred and dispersed at 65° C. for 30 h. During the process, the mixed solution in the growth bottle changes from yellow to light green, and finally tends to be transparent and clear, and finally the $Cs_4PbBr_6$ single crystal thin film is formed. The molar ratio of the first halide CsBr to the second halide $PbBr_2$ to the solvent is 4:1:4; the organic solvent in the solvent is N,N-dimethylformamide, and the volume ratio of the N,N-dimethylformamide to the additive is 5:1.

(2) The transparent conductive electrode is formed on one surface of the grown $Cs_4PbBr_6$ single crystal thin film by sputtering or transferring, etc., and then the metal electrode is evaporated on the other surface of the $Cs_4PbBr_6$ single crystal thin film, to obtain the quantum dot light-emitting device.

The foregoing descriptions are merely illustrative embodiments of the present disclosure, and are not intended to limit the present disclosure. Within the spirit and principles of the disclosure, any modifications, equivalent substitutions, improvements, etc., are within the protection scope of the present disclosure.

The invention claimed is:

1. A preparing method for a quantum dot light-emitting layer, comprising:
   placing a first halide AX and a second halide $BX_2$ in a solvent;
   stirring and dispersing a reaction system formed by the first halide AX, the second halide $BX_2$ and the solvent at a set temperature for a set time period; and
   cooling the reaction system at a cooling rate of 0.1° C./24 h-1° C./24 h to generate an $A_4BX_6$ single crystal thin film containing $ABX_3$ quantum dots, and using the $A_4BX_6$ single crystal thin film containing $ABX_3$ quantum dots as the quantum dot light-emitting layer; and wherein A comprises one of Cs+, CH3NH3+ and HC(NH2)2+;
B comprises one of Pb2+ and Sn2+; and
X comprises one of Cl—, Br— and I—.

2. The preparing method for the quantum dot light-emitting layer according to claim 1, wherein a molar ratio of the first halide AX to the second halide BX2 to the solvent is 3-6:1:3-6.

3. The preparing method for the quantum dot light-emitting layer according to claim 1, wherein the solvent comprises: an organic solvent and an additive with a volume ratio of 1-5:1; and
the additive comprises hydrohalic acid.

4. The preparing method for the quantum dot light-emitting layer according to claim 1, wherein the set temperature comprises 60° C.-80° C.; and
the set time period comprises 20 h-30 h.

5. A preparing method for a quantum dot light-emitting device, comprising:
forming a quantum dot light-emitting layer by the preparing method for the quantum dot light-emitting layer according to claim 1;
forming a first electrode; and
forming a second electrode.

6. A method according to claim 5, wherein the forming the first electrode comprises: forming a transparent conductive electrode;
a step of forming a hole transport layer on the transparent conductive electrode is comprised between the forming the transparent conductive electrode and the forming the quantum dot light-emitting layer; a step of forming an electron transport layer on the quantum dot light-emitting layer is comprised between the forming the quantum dot light-emitting layer and the forming the second electrode; and the forming the second electrode comprises: forming a metal electrode on the electron transport layer.

7. A method according to claim 5, wherein the forming the first electrode comprises: forming a transparent conductive electrode;
a step of forming an electron transport layer on the transparent conductive electrode is comprised between the forming the transparent conductive electrode and the forming the quantum dot light-emitting layer; a step of forming a hole transport layer on the quantum dot light-emitting layer is comprised between the forming the quantum dot light-emitting layer and the forming the second electrode; and the forming the second electrode comprises: forming a metal electrode on the hole transport layer.

8. A method according to claim 5, wherein the forming the first electrode comprises: forming a transparent conductive electrode;
a step of forming the quantum dot light-emitting layer on the transparent conductive electrode is comprised between the forming the transparent conductive electrode and the forming the second electrode; and the forming the second electrode comprises: forming a metal electrode.

9. A method according to claim 5, wherein the forming the first electrode comprises:
forming a transparent conductive electrode on one surface of the quantum dot light-emitting layer; and
the forming the second electrode comprises: forming a metal electrode on the other surface of the quantum dot light-emitting layer.

* * * * *